(12) United States Patent
Park et al.

(10) Patent No.: US 12,433,147 B2
(45) Date of Patent: Sep. 30, 2025

(54) FLEXIBLE DISPLAY DEVICE

(71) Applicant: LG Display Co., Ltd., Seoul (KR)

(72) Inventors: Youngjoo Park, Busan (KR); Eun Roh, Seoul (KR); Taehyoung Kwak, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 635 days.

(21) Appl. No.: 17/839,124

(22) Filed: Jun. 13, 2022

(65) Prior Publication Data

US 2023/0029166 A1 Jan. 26, 2023

(30) Foreign Application Priority Data

Jul. 16, 2021 (KR) .................. 10-2021-0093557

(51) Int. Cl.

| | |
|---|---|
| *H01L 51/52* | (2006.01) |
| *G06F 1/16* | (2006.01) |
| *G09F 9/30* | (2006.01) |
| *H01L 51/00* | (2006.01) |
| *H10K 59/80* | (2023.01) |
| *H10K 77/10* | (2023.01) |
| *H10K 102/00* | (2023.01) |

(52) U.S. Cl.
CPC .......... *H10K 77/111* (2023.02); *G06F 1/1652* (2013.01); *G09F 9/301* (2013.01); *H10K 59/873* (2023.02); *H10K 2102/311* (2023.02)

(58) Field of Classification Search
CPC .............................. G09F 9/301; H10K 77/111
See application file for complete search history.

(56) References Cited

U.S. PATENT DOCUMENTS

| | | | |
|---|---|---|---|
| 2015/0036300 A1* | 2/2015 | Park ................. | H05K 1/147 |
| | | | 156/212 |
| 2016/0357052 A1* | 12/2016 | Kim ................. | G02F 1/133305 |
| 2017/0062742 A1* | 3/2017 | Kim ................. | H10K 50/844 |
| 2017/0338286 A1 | 11/2017 | Oh et al. | |
| 2018/0096635 A1 | 4/2018 | Park et al. | |
| 2018/0181165 A1* | 6/2018 | Park ................. | G06F 1/1652 |

(Continued)

FOREIGN PATENT DOCUMENTS

| | | |
|---|---|---|
| CN | 107425037 A | 12/2017 |
| CN | 107886847 A | 4/2018 |

(Continued)

OTHER PUBLICATIONS

Office Action dated Office Action and Search Report dated Jun. 7, 2025 issued in corresponding Chinese Patent Application No. 202210696265.4 with the English translation.

*Primary Examiner* — Victoria K. Hall
(74) *Attorney, Agent, or Firm* — Morgan, Lewis & Bockius LLP

(57) ABSTRACT

The present disclosure relates to a flexible display device, and more particularly a flexible display device includes a display panel, a back plate disposed below the display panel; and a plate bottom disposed below the back plate, and the back plate includes a base member and a hard coating layer disposed on at least one surface of the base member. The present disclosure provides a flexible display device which minimizes dent or puncture failures and reduces a rigidity difference between the folding area and the non-folding area without including a plate top or an impact absorption layer to have excellent durability.

16 Claims, 6 Drawing Sheets

(56) References Cited

U.S. PATENT DOCUMENTS

| | | | |
|---|---|---|---|
| 2020/0154185 A1 | 5/2020 | Kim et al. | |
| 2020/0234616 A1* | 7/2020 | Ha | G09F 9/301 |
| 2021/0174711 A1 | 6/2021 | Cho et al. | |
| 2021/0202879 A1* | 7/2021 | Park | G02B 1/14 |
| 2022/0050543 A1* | 2/2022 | Luo | G06F 3/0443 |
| 2022/0392816 A1* | 12/2022 | Oh | H10K 77/111 |

FOREIGN PATENT DOCUMENTS

| | | |
|---|---|---|
| CN | 112951084 A | 6/2021 |
| KR | 10-2016-0144912 A | 12/2016 |
| KR | 10-2020-0058059 A | 5/2020 |
| KR | 10-2020-0106789 A | 9/2020 |

\* cited by examiner

FLEXIBLE DISPLAY DEVICE

CROSS-REFERENCE TO RELATED APPLICATIONS

This application claims the priority of Korean Patent Application No. 10-2021-0093557 filed on Jul. 16, 2021, in the Korean Intellectual Property Office, the disclosure of which is incorporated herein by reference.

BACKGROUND

Technical Field

The present disclosure relates to a flexible display device, and more particularly to a flexible display device with excellent rigidity and durability and improved dent characteristic.

Discussion of the Related Art

Recently, as it enters an information era, a display field which visually expresses electrical information signals has been rapidly developed and in response to this, various display devices having excellent performances such as thin-thickness, light weight, and low power consumption have been developed. Specific examples of such a display device include a liquid crystal display device (LCD), a plasma display panel device (PDP), a field emission display device (FED), and an organic light emitting display device (OLED).

In the meantime, efforts are being continued to diversify a shape and a size of the display device. For example, display devices having various shapes, such as a curved display device having a curved surface or a flexible display device which maintains its display performance even in a bent or curved state, are consistently being developed. A display panel of the flexible display device uses a flexible substrate so that a support member such as a back plate is disposed below the display panel to suppress the sagging of the display panel and protect the display panel from foreign materials and impact from the outside.

SUMMARY

The back plate is a thin film so that when the back plate is solely used as a support member, there is a problem in that the rigidity is not sufficient. Therefore, various durability reinforcement layers such as a plate top, a plate bottom, and an impact absorption layer are combined to be used on a rear surface of the back plate. Specifically, in order to simultaneously satisfy the rigidity and the impact resistance, a plate top, a plate bottom, and a silicon-based impact absorption layer are combined to be used below the back plate or the silicon-based impact absorption layer and the plate bottom are combined to be used. By doing this, even though the rigidity and the impact resistance may be ensured, the thickness of the flexible display device is increased so that the folding characteristic is degraded and the reduction of the radius of curvature is limited.

Therefore, in order to reduce the radius of curvature, when the plate top or the impact absorption layer is removed, the rigidity is lowered and a failure due to dent or puncture is caused on the surface during the folding. Specifically, a larger stress is applied to the folding area during the folding so that the durability is more vulnerable.

Further, an opening pattern is formed on the plate bottom so as to correspond to the folding area to improve the folding characteristic. When the plate top is removed, the opening pattern is visible to the user so that the exterior appearance quality is degraded.

Accordingly, embodiments of the present disclosure are directed to a flexible display device that substantially obviates one or more of the problems due to limitations and disadvantages of the related art.

Therefore, an aspect of the present disclosure is to provide a flexible display device which has an excellent rigidity without including a plate top or an impact absorption layer.

Another aspect of the present disclosure is to provide a flexible display device which minimizes dent or puncture failures and reduces a rigidity difference between the folding area and the non-folding area without including a plate top or an impact absorption layer to have excellent durability.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a flexible display device includes a display panel, a back plate disposed below the display panel; and a plate bottom disposed below the back plate, and the back plate includes a base member and a hard coating layer disposed on at least one surface of the base member.

Other detailed matters of the exemplary embodiments are included in the detailed description and the drawings.

According to the present disclosure, a flexible display device includes a hard coating layer on at least one surface of the back plate to provide excellent rigidity without including the plate top or the impact absorption layer.

Further, according to the present disclosure, the flexible display device may minimize the generation of the dent or puncture during the folding without including the plate top or the impact absorption layer.

Further, according to the present disclosure, the flexible display device provides an excellent durability by the reduced rigidity difference between folding area and the non-folding area.

According to the present disclosure, the flexible display device does not include the plate top or the impact absorption layer to have a simple structure and simplifies the manufacturing process to contribute to the improvement of a productivity.

Further, according to the present disclosure, the flexible display device does not include a plate top or an impact absorption layer so that an adhesive layer for bonding them is not necessary, thereby reducing a thickness of the flexible display device. Further, as the thickness is reduced, the radius of curvature may be reduced while maintaining a folding characteristic to be high.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
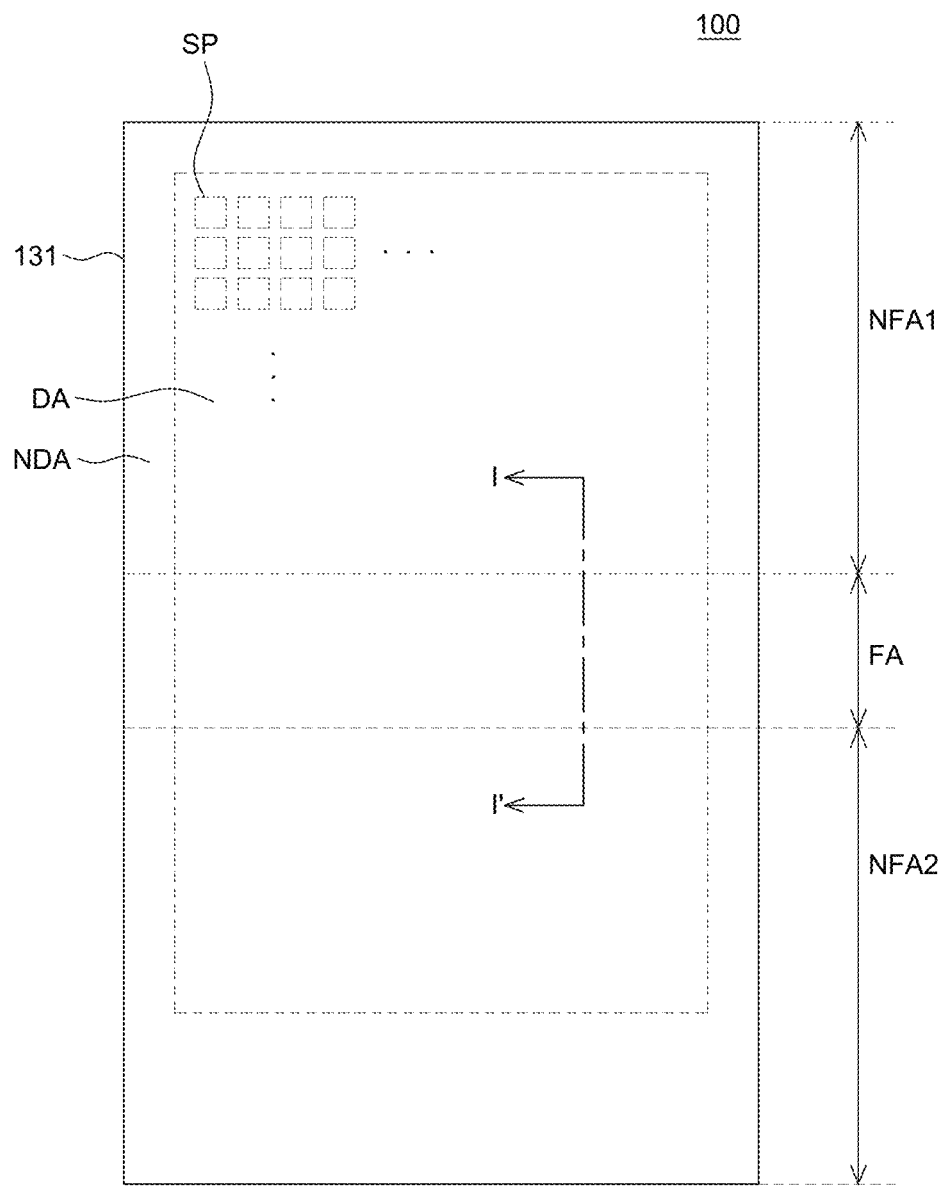
FIG. 1 is a plan view of a flexible display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a flexible display device according to exemplary embodiments of the present disclosure will be described in detail with reference to accompanying drawings.

Figure 2:
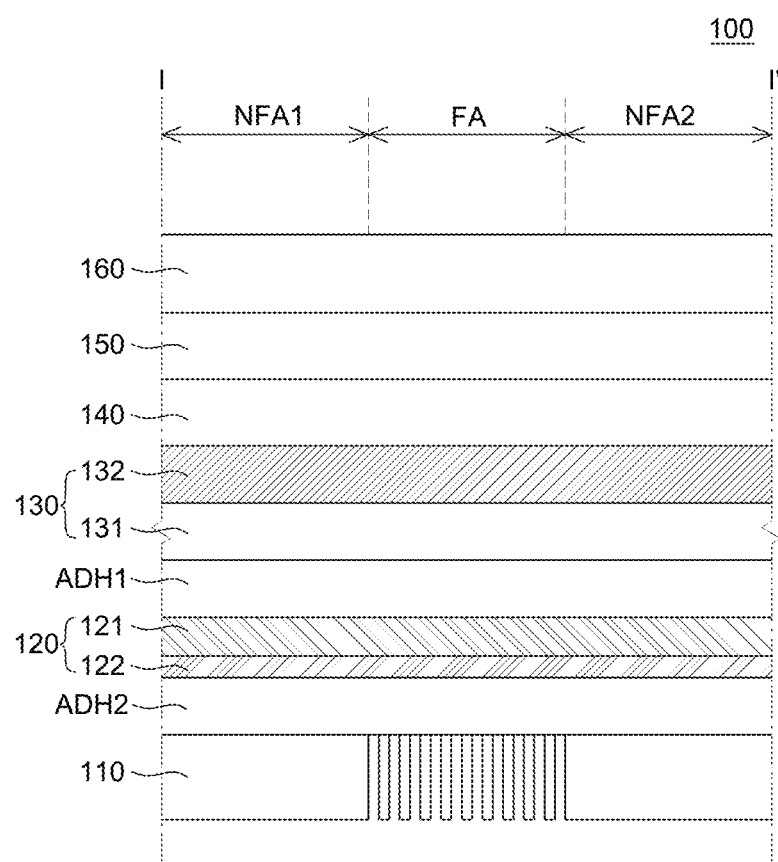
FIG. 2 is a cross-sectional view taken along the line I-I' of FIG. 1.

FIG. 1 is a plan view of a flexible display device according to an exemplary embodiment of the present disclosure. FIG. 2 is a cross-sectional view taken along the line I-I' of FIG. 1. Referring to FIGS. 1 and 2 together, a flexible display device 100 according to an exemplary embodiment of the present disclosure includes a display panel 130, a back plate 120, a plate bottom 110, a first adhesive layer ADH1, a second adhesive layer ADH2, an optical control layer 140, a decoration layer 150, and a cover member 160. The back plate 120 includes a base member 121 and a hard coating layer 122.

Hereinafter, components of the flexible display device 100 according to an exemplary embodiment of the present disclosure will be described.

The flexible display device 100 may be divided into a folding area FA and non-folding areas NFA1 and NFA2 depending on whether to be folded. The folding area FA is an area which is folded when the flexible display device 100 is folded and is folded in accordance with a specific radius of curvature with respect to a folding axis. For example, the folding axis of the folding area FA may be formed in an X-axis direction and the non-folding areas NFA1 and NFA2 may extend from the folding area FA in a Y-axis direction which is perpendicular to the folding axis. When the folding area FA is folded with respect to the folding axis, the folding area FA may form a part of a circle or an oval. At this time, a radius of curvature of the folding area FA may refer to a radius of a circle or an oval formed by the folding area FA.

The non-folding areas NFA1 and NFA2 are areas which are not folded when the flexible display device 100 is folded. That is, the non-folding areas NFA1 and NFA2 maintain a flat state when the flexible display device 100 is folded. The non-folding areas NFA1 and NFA2 may be located on both sides of the folding area FA. That is, the non-folding units NFA1 and NFA2 may be areas extending to the Y-axis direction with respect to the folding axis. At this time, the folding area FA may be defined between the non-folding areas NFA1 and NFA2. Further, when the flexible display device 100 is folded with respect to the folding axis, the non-folding areas NFA1 and NFA2 may overlap each other.

When a top surface of the flexible display device 100 on which images are displayed is defined as a display surface and a bottom surface of the flexible display device 100 which is an opposite surface of the display surface is defined as a rear surface, the folding area FA may be folded by a method selected from an out-folding method and an in-folding method. According to the out-folding method, the folding area is folded to expose the display surface of the flexible display device 100 to the outside and according to the in-folding method, the folding area is folded such that display surfaces of the flexible display device 100 face each other.

The display panel 130 displays images. For example, the display panel 130 may be a liquid crystal display panel which adjusts a light transmittance of liquid crystals to display images. As another example, the display panel 130 may be an organic light emitting display panel which includes an organic light emitting layer to display images using light emitted from the organic light emitting layer. Hereinafter, for the convenience of description, the description will be made with an example that the display panel is an organic light emitting display panel, but it is not limited thereto.

The display panel 130 may include a flexible substrate 131 and an organic light emitting diode 132.

The flexible substrate 131 includes a display area DA and a non-display area NDA.

The display area DA is an area where a plurality of pixels is disposed to substantially display images. In the display area DA, a plurality of pixels which includes an emission area to display images, a thin film transistor for driving the pixels, and a capacitor may be disposed. One pixel may include a plurality of sub pixels SP. The sub pixel SP is a minimum unit which configures the display area DA and each sub pixel SP may be configured to emit light of a specific wavelength band. For example, each of the sub pixels SP may be configured to emit red light, green light, blue light, or white light.

The non-display area NDA is disposed so as to enclose the display area DA. The non-display area NDA is an area where images are not substantially displayed and various wiring lines and driving ICs for driving the pixels and the driving elements disposed in the display area DA are disposed therein.

The flexible substrate 131 supports various elements which configure the display panel 130. The flexible substrate 131 may be a plastic substrate having flexibility. For example, the plastic substrate may be selected from polyimide, polyethersulfone, polyethylene terephthalate, and polycarbonate, but is not limited thereto. The plastic substrate has a relatively weak barrier characteristic against moisture or oxygen so that in order to compensate therefor, the plastic substrate may have a structure in which a plastic film and an inorganic film are laminated. For example, the flexible substrate 131 may have a multilayered structure in which a first polyimide film, an inorganic film, and a second polyimide film are sequentially laminated.

The organic light emitting diode 132 is disposed on the flexible substrate 131. The organic light emitting diode 132 may include an anode, a cathode, and an organic light emitting layer disposed therebetween. In the organic light emitting diode 132, holes injected from the anode and electrons injected from the cathode are coupled on the organic light emitting layer to emit light. The image may be displayed using the light emitted as described above.

A driving thin film transistor may be disposed between the flexible substrate 131 and the organic light emitting diode 132 to drive the organic light emitting diode 132. The driving thin film transistor may be disposed in each of the plurality of sub pixel (SP) areas. For example, the driving thin film transistor may include a gate electrode, an active layer, a source electrode, and a drain electrode. Specifically, for example, the active layer is disposed on the flexible substrate 131 and a gate insulating layer is disposed on the active layer to insulate the active layer from the gate electrode. Further, an interlayer insulating layer which insulates the gate electrode from the source electrode and the drain electrode is disposed on the flexible substrate 131. The source electrode and the drain electrode which are in contact with the active layer are formed on the interlayer insulating layer. A planarization layer may be disposed between the thin film transistor and the organic light emitting diode 132. The planarization layer planarizes an upper portion of the thin film transistor. The planarization layer may include a contact hole which electrically connects the thin film transistor and the anode.

When the flexible display device 100 is folded or bent, the display panel 130 having a flexibility may have a difficulty to maintain a predetermined shape and may be vulnerable to external stimulus.

Accordingly, various types of supporting members may be disposed on the rear surface of the display panel 130. For example, a back plate 120 and a plate bottom 110 may be disposed on the rear surface of the display panel 130.

When a plastic flexible substrate 131 is used, a thickness is small so that the display panel 130 may be sagged during the folding or bending and in order to supplement for this, a back plate 120 may be disposed on the rear surface of the display panel 130.

The first adhesive layer ADH1 is disposed between the back plate 120 and the display panel 130. The first adhesive layer ADH1 bonds the back plate 120 and the display panel 130. The first adhesive layer ADH1 may be selected from an optical clear adhesive (OCA), an optical clear resin (OCR), and a pressure sensitive adhesive (PSA), but is not limited thereto.

The back plate 120 includes a base member 121 and a hard coating layer 122. The base member 121 supports the flexible substrate 131 so as not to be sagged. A plastic film may be used as the base member 121 to maintain the folding characteristic to be high while supporting the flexible substrate 131. For example, the plastic film may be selected from polyethylene terephthalate film, a polyimide film, and polyamideimide film.

The polyimide film or the polyamideimide film does not have dynamic scattering phenomenon during the folding and has excellent mechanical rigidity. Therefore, it is easy to implement a flexible display device having a larger radius of curvature. The polyethylene terephthalate film has a cheaper price relatively, but has an insufficient rigidity as compared with the polyimide or polyamideimide film. However, as it will be described below, the hard coating layer 122 is formed on one surface of the polyethylene terephthalate film to supplement the rigidity. Specifically, polyethylene terephthalate has superior solubility in solvents as compared with polyimide or polyamideimide. Accordingly, the polyethylene terephthalate film may form the hard coating layer 122 to have a thickness larger than the polyimide or polyamideimide film so that the rigidity may be supplemented.

For example, a thickness of the base member 121 may be 40 μm to 80 μm. Within this range, it is possible to support the flexible substrate 131 and maintain the folding characteristic to be high.

The hard coating layer 122 is disposed on a lower surface of the base member 121. The hard coating layer 122 improves a rigidity of the base member 121. Therefore, even though the plate top or the impact absorption layer is not disposed below the back plate 120, the rigidity of the flexible display device 100 may be maintained to be high.

The hard coating layer 122 may be formed to be in direct contact with the base member 121 by means of a known coating method, without using an adhesive member such as an optical clear adhesive. For example, the hard coating layer 122 may be formed on the base member 121 by a known method such as a slit coating method, a bar coating method, a dip coating, spin coating, a dispensing method, or a screen printing method.

A thickness of the hard coating layer 122 may be 30 μm to 60 μm or 40 μm to 50 μm. When the thickness of the hard coating layer is 30 μm or less, the rigidity improvement effect of the flexible display device 100 is insignificant and the restoring force for the dent of the flexible display device 100 is reduced. Further, when the thickness of the hard coating layer 122 exceeds 60 μm, the folding characteristic may be degraded. Further, in order to form the thickness of the hard coating layer to be equal to or larger than 60 μm, a ratio of the silicon-based resin of the hard coat composition needs to be increased. However, when the ratio of the silicon-based resin is increased, a ratio of the solvent is relatively reduced so that the adhesiveness of the hard coating layer formed by the hard coat composition with this ratio with the base member is lowered. Therefore, there may be a problem in that the hard coating layer is loosened from the base member and the crack is generated during the folding. For reference, polyethylene terephthalate has superior solubility in solvents to polyimide or polyamideimide. Accordingly, when the thickness of the hard coating layer is formed to be large, for example, 50 μm to 60 μm, in order to ensure the adhesiveness between the base member 121 and the hard coating layer 122, the polyethylene terephthalate film may be used as a base member.

The hard coating layer 122 includes a silicon-based resin. The silicon-based resin has excellent impact resistance and recovery characteristic against the dent. Accordingly, a mechanical property such as a durability or an impact resistance of the flexible display device 100 may be significantly improved.

For example, the silicon-based resin may be formed from an epoxy modified silicon polymer.

Specifically, for example, the silicon-based resin may be formed from epoxy modified siloxane oligomers having different epoxy equivalents. For example, the silicon-based resin may be formed by polymerizing a hard coat composition including a first epoxy modified siloxane oligomer and a second epoxy modified siloxane oligomer having a different epoxy equivalent. In this case, it is further advantageous in that the recovery characteristic against the dent of the flexible display device 100, the folding characteristic, and the durability are further excellent.

The hard coat composition may further include one or more types selected from a urethane acrylate-based linker, an acrylate-based linker, and an epoxy-based linker. When the hard coat composition further includes a linker, the folding characteristic may be maintained to be high without being degraded while improving the dent recovery characteristic of the flexible display device 100.

Further, the hard coat composition may further include an initiator which cures the hard coat composition by means of optical and chemical reactions.

Further, the epoxy equivalent of the epoxy modified siloxane oligomer may be adjusted according to a type of the base member 121. For example, as the base member 121, the polyethylene terephthalate film has advantages of cheap price and easy of supplying, but the mechanical property is relatively lower than the polyimide film or the polyamideimide film. Therefore, when the polyethylene terephthalate film is used as the base member, in order to supplement the mechanical property, the hard coating layer 122 may be formed with an epoxy modified siloxane oligomer having a relatively large epoxy equivalent.

Further, when the hard coating layer 122 is formed by mixing a first epoxy modified siloxane oligomer and a second epoxy modified siloxane oligomer, the difference between an epoxy equivalent of the first epoxy modified siloxane oligomer and an epoxy equivalent of the second epoxy modified siloxane oligomer may be significant depending on the type of base member 121. When the polyethylene terephthalate film is used as the base member 121, as described above, in order to supplement the mechanical property, it is desirable that the epoxy equivalents of the first and second epoxy modified siloxane oligomers is high. Accordingly, when the polyethylene terephthalate film is used, a difference of the epoxy equivalent of the first epoxy modified siloxane oligomer and the epoxy equivalent of the second epoxy modified siloxane oligomer may be smaller than a case that the polyimide film or the polyamideimide film is used as a base member 121.

The plate bottom 110 is disposed below the back plate 120. The second adhesive layer ADH2 is disposed between the back plate 120 and the plate bottom 110. That is, the second adhesive layer ADH2 is disposed between the hard coating layer 122 of the back plate 120 and the plate bottom 110. The second adhesive layer ADH2 bonds the back plate 120 and the plate bottom 110. The second adhesive layer ADH2 may be selected from an optical clear adhesive (OCA), an optical clear resin (OCR), and a pressure sensitive adhesive (PSA), but is not limited thereto.

The plate bottom 110 is disposed below the back plate 120 to enhance the rigidity of the flexible substrate 131 and the back plate 120 which are formed of a plastic material. For example, the plate bottom 110 may be formed of a metal material such as stainless steel (SUS), invar, aluminum, or magnesium. Such a metal material has a higher strength than the plastic material so that the durability of the flexible display device 100 may be further improved.

At least one opening pattern may be formed on the plate bottom 110 so as to correspond to the folding area FA of the flexible display device 100. The opening pattern allows the plate bottom 110 of the folding area FA to be easily folded and effectively relieves the stress applied to the plate bottom 110 during the folding. Further, in order to easily restore after the folding, the folding characteristic of the flexible display device 100 may be improved. The opening patterns may be formed with different shapes or different intervals in the folding area FA. For example, the opening pattern may have a rectangular shape, a rhombus shape, or a circular shape.

In the flexible display device of the related art, a plate top or an impact absorption layer is disposed between the plate bottom and the back plate. In the flexible display device 100 of the present disclosure, the hard coating layer 122 formed on the base member 121 serves as the plate top or the impact absorption layer. Accordingly, even though the plate top or the impact absorption layer is not provided, the mechanical property of the flexible display device 100, such as a durability, a dent recovery ability, and an impact resistance are desirably good.

The optical control layer 140 is disposed on the display panel 130. The optical control layer 140 uniformly transmits light emitted from the display panel 130 to the outside without lowering a luminance of the flexible display device 100 and absorbs or reflects external light to improve a display quality. For example, the optical control layer 140 may be a polarizing film, but is not limited thereto.

The optical control layer 140 may be bonded onto the display panel 130 by means of an optical clear adhesive or a pressure sensitive adhesive.

A decoration layer 150 may be disposed on the optical control layer 140. The decoration layer 150 may be bonded onto the optical control layer 140 by means of an optical clear adhesive or a pressure sensitive adhesive. The decoration layer 150 may include a decoration pattern formed with a material which absorbs light and an over coat layer formed of a transparent resin. For example, the decoration pattern may be formed of an optical absorption metal, carbon black, black resin, or the like. The decoration pattern is formed so as to overlap the non-active area NDA of the display panel 130. Therefore, the decoration layer 150 does not allow components such as wiring lines disposed in the non-display area NDA to be visible to the outside. Further, the decoration layer 150 also serves to suppress the light leakage through the side surface of the flexible display device 100. The decoration pattern may be disposed so as to be adjacent to a lower surface of the cover member 160. However, it is not limited thereto and the decoration pattern may be disposed below the decoration layer 150 to be adjacent to the optical control layer 140. The over coat layer covers a step formed by the decoration pattern to planarize a surface on which the decoration pattern is formed. For example, the over coat layer may include one or more types selected from acrylic-based resin, epoxy-based resin, siloxane-based resin, and urethane-based resin, but is not limited thereto.

The cover member 160 is disposed on the decoration layer 150. The cover member 160 protects the display panel 130 so as not to be damaged by an external impact or deteriorated by moisture, oxygen, or foreign materials entering from the outside. The cover member 160 may be bonded onto the decoration layer 150 by means of an optical clear adhesive or a pressure sensitive adhesive.

The cover member 160 may be formed of a material which is transparent and has excellent impact resistance and scratch resistance. For example, the cover member 160 may be a film formed of a polymer, such as polyimide, polyamide imide, polyethylene terephthalate, polymethyl methacrylate, polypropylene glycol, and polycarbonate. As another example, the cover member 160 may be a film formed of a photoisotropic polymer such as cycloolefin (co)polymer, photoisotropic polycarbonate, or photoisotropic polymethyl methacrylate. As still another example, the cover member 160 may be formed of a chemically strengthened thin plate glass.

Further, various functional layers such as an external light reflection reducing layer, a UV blocking layer, or a hard coating layer may be disposed on the cover member 160. Further, when the cover member 160 is formed of a thin plate glass, a protective film may be disposed on the cover member 160 to suppress the scattering.

The flexible display device 100 according to the exemplary embodiment of the present disclosure includes a back plate 120 on which a hard coating layer 122 including a silicon-based resin is formed below the base member 121. By doing this, even though the plate top or the impact absorption layer is not included, the dent or puncture generated during the folding may be minimized.

Further, the hard coating layer 122 does not allow the pattern formed on the plate bottom 110 corresponding to the folding area FA to be visible to the outside of the flexible display device 100.

Further, in the flexible display device 100 according to the present disclosure, the difference of rigidity between the folding area FA and the non-folding areas NFA1 and NFA2 is reduced so that the excellent durability may be provided.

Further, according to the present disclosure, the flexible display device 100 does not include the plate top or the impact absorption layer to have a simple structure and simplifies the manufacturing process to contribute to the improvement of a productivity.

Further, the flexible display device 100 according to the present disclosure does not include a plate top or an impact absorption layer so that an adhesive layer for bonding them is not necessary, thereby reducing a thickness of the flexible display device 100. As described above, as the thickness of the flexible display device 100 is reduced, the radius of curvature may be reduced while maintaining a folding characteristic to be high.

For example, the flexible display device 100 according to the present disclosure may be implemented as a flexible display device having the folding area FA with a large curvature of 3R or less, and further 1.5R or less. In the present specification, the radius of curvature 1R means that a radius of a curved surface of the folding area FA during the folding is 1 mm.

Figure 3:
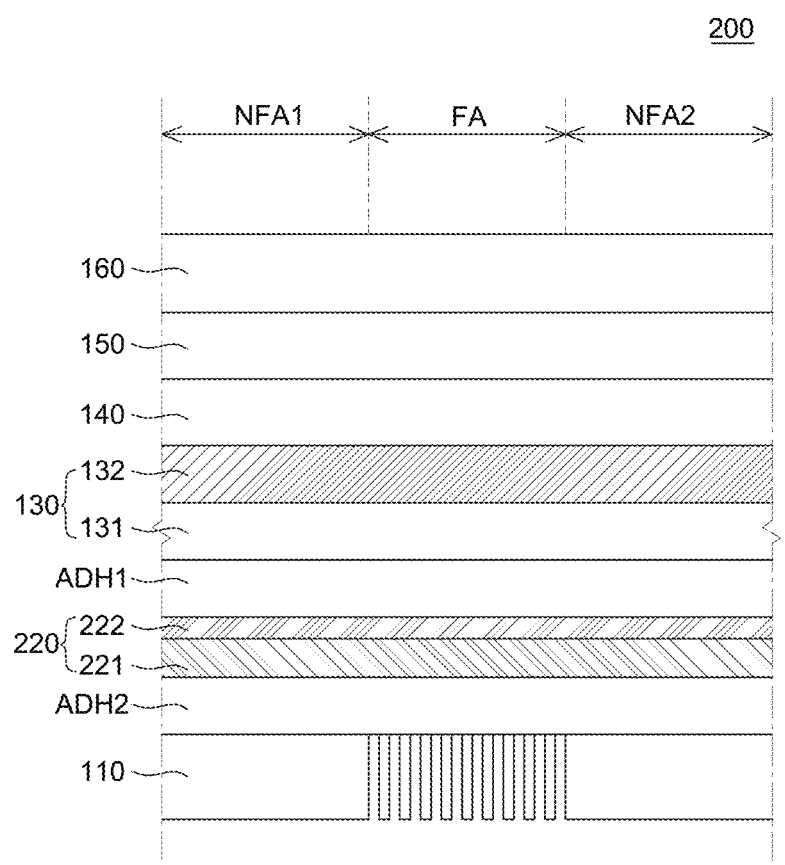
FIG. 3 is a cross-sectional view of a flexible display device according to another exemplary embodiment of the present disclosure.

FIG. 3 is a cross-sectional view of a flexible display device according to another exemplary embodiment of the present disclosure. Except for a placement position of the hard coating layer, a flexible display device 200 illustrated in FIG. 3 is substantially the same as the flexible display device 100 illustrated in FIGS. 1 and 2, so that a redundant description will be omitted.

Referring to FIG. 3, the hard coating layer 222 is disposed above the base member 221. The first adhesive layer ADH1 is disposed between the hard coating layer 222 of the back plate 220 and the display panel 130. Therefore, the hard coating layer 222 of the back plate 220 and the display panel 130 are bonded by the first adhesive layer ADH1. The second adhesive layer ADH2 is disposed between the base member 221 of the back plate 220 and the plate bottom 110. Therefore, the base member 221 and the plate bottom 110 are bonded by the second adhesive layer ADH2.

As illustrated in FIG. 3, when the hard coating layer 222 is disposed above the base member 221, the dent recovery ability in the folding area FA and the non-folding areas NFA1 and NFA2 of the flexible display device 200 is further improved and the puncture failure is further minimized. Therefore, it is possible to provide a flexible display device 200 having a more excellent durability.

The plate bottom 110 includes an opening pattern corresponding to the folding area FA to ease the folding and in this case, an impact rigidity of the folding area FA is lower than an impact rigidity of the non-folding areas NFA1 and NFA2. As described above, the improvement of the durability may be restricted due to the difference of the rigidities of the folding area FA and the non-folding areas NFA1 and NFA2. When the hard coating layer 222 is disposed above the base member 221, the impact rigidity of the folding area FA may be further improved and thus, the difference of the impact rigidities of the folding area FA and the non-folding areas NFA1 and NFA2 is reduced, and the durability may be improved.

Figure 4:
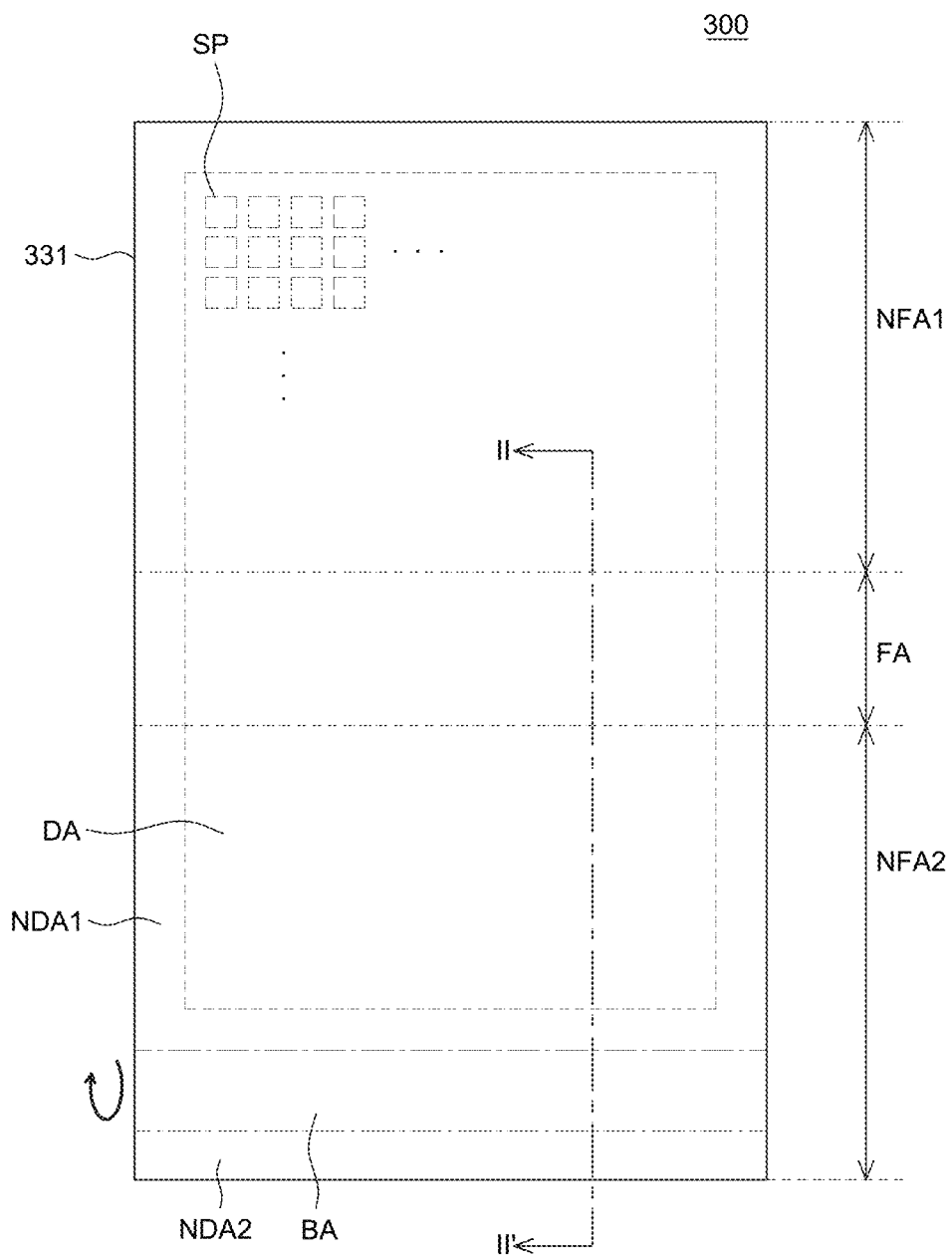
FIG. 4 is a plan view of a flexible display device according to still another exemplary embodiment of the present disclosure.
Figure 5:
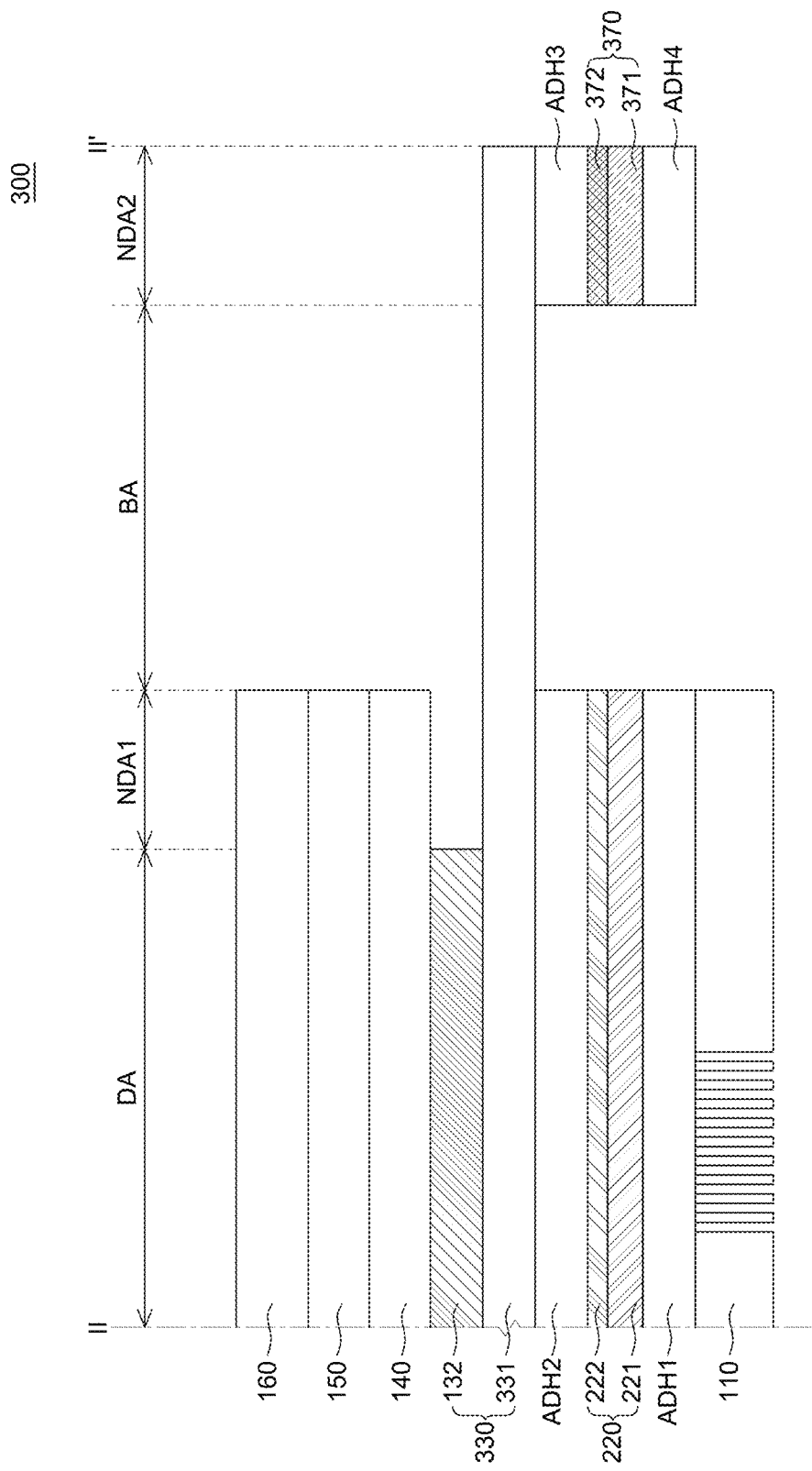
FIG. 5 is a cross-sectional view taken along the line II-II' of FIG. 4.
Figure 6:
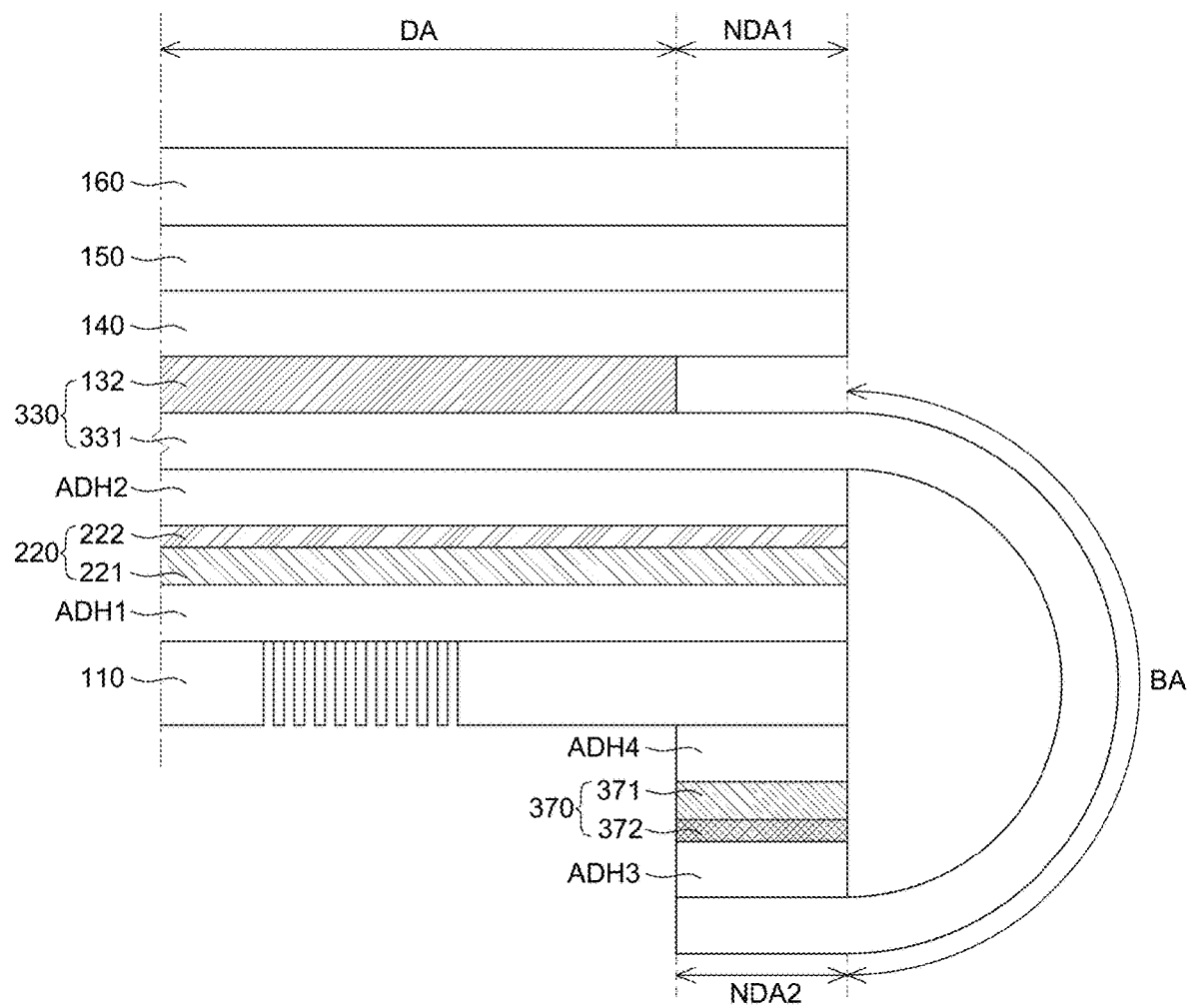
FIG. 6 is a cross-sectional view when a flexible display device according to still another exemplary embodiment of the present disclosure is bent.

FIGS. 4 to 6 are views for explaining a flexible display device according to still another exemplary embodiment of the present disclosure. FIG. 4 is a plan view of a flexible display device according to still another exemplary embodiment of the present disclosure. FIG. 5 is a cross-sectional view taken along the line II-II' of FIG. 4. FIG. 6 is a cross-sectional view when a flexible display device according to still another exemplary embodiment of the present disclosure is bent.

The flexible display device 300 illustrated in FIGS. 4 to 6 is substantially the same as the flexible display device 200 illustrated in FIG. 3 except that the flexible substrate has a bendable area and further includes an auxiliary back plate, a third adhesive layer, and a fourth adhesive layer. Therefore, a redundant description will be omitted.

Referring to FIGS. 4 to 6, the flexible substrate 331 of display panel 330 may include at least one bendable area BA having a bending ability. For example, the flexible substrate 331 includes a display area DA, a first non-display area NDA1, a bendable area BA, and a second non-display area NDA2. The first non-display area NDA1 is disposed to enclose four corners of the display area DA. The first non-display area NDA1 which encloses at least one of four corners of the display area DA outwardly extends to form the bendable area BA and the second non-display area NDA2. For the convenience of description, in FIG. 4, even though it is illustrated that one side of the first non-display area NDA1 which encloses one of four corners of the display area DA extends, it is not limited thereto.

The bendable area BA may extend from one side of the first non-display area NDA1 to be disposed. The bendable area BA is an area where the flexible substrate 331 is bent. The first non-display area NDA1 may be a part which is substantially flat and the bendable area BA may be bent at a predetermined bending angle from the first non-display area NDA1. As described above, as a part of the non-display area is bent toward the rear surface of the flexible substrate 331, a bezel area may be reduced.

The second non-display area NDA2 may extend from one side of the bendable area BA to be disposed. That is, the bendable area BA is disposed between the first non-display area NDA1 and the second non-display area NDA2.

The auxiliary back plate 370 is disposed on a lower surface of the flexible substrate 331 corresponding to the second non-display area NDA2. The auxiliary back plate 370 is disposed on the same surface as the back plate 220. The auxiliary back plate 370 is disposed to be spaced apart from the back plate 220. The auxiliary back plate 370 may be formed using the same material by the same process as the back plate 220. Therefore, the auxiliary back plate 370 may have a structure in which the same layer formed of the same material as the back plate 220 is laminated.

For example, the auxiliary back plate 370 includes an auxiliary base member 371 and an auxiliary hard coating layer 372. The auxiliary base member 371 is formed of the same material as the base member 221 of the back plate 220. The auxiliary hard coating layer 372 is formed of the same material as the hard coating layer 222 of the back plate 220. Even though in FIG. 5, it is illustrated that the auxiliary hard coating layer 372 is disposed on an upper surface of the auxiliary base member 371, it is not limited thereto. When the back plate 220 has a structure in which the hard coating layer 222 is disposed below the base member 221, the auxiliary back plate 370 also has the same structure in which the auxiliary hard coating layer 372 is disposed below the auxiliary base member 371.

Referring to FIG. 5, the third adhesive layer ADH3 may be disposed between the auxiliary back plate 370 and the flexible substrate 331 in the second non-display area NDA2. The third adhesive layer ADH3 is disposed between the flexible substrate 331 and the auxiliary hard coating layer 372 to bond the flexible substrate 331 and the auxiliary back plate 370. The third adhesive layer ADH3 may be the same as the second adhesive layer ADH2. The third adhesive layer ADH3 may be selected from an optical clear adhesive (OCA), an optical clear resin (OCR), and a pressure sensitive adhesive (PSA), but is not limited thereto.

Referring to FIG. 5 continuously, the fourth adhesive layer ADH4 may be disposed below the auxiliary back plate 370. The fourth adhesive layer ADH4 is disposed to be in contact with the base member 371 of the auxiliary back plate 370. The fourth adhesive layer ADH4 may be the same as the first adhesive layer ADH1. The fourth adhesive layer ADH4 may be selected from an optical clear adhesive (OCA), an optical clear resin (OCR), and a pressure sensitive adhesive (PSA), but is not limited thereto.

Hereinafter, it is specifically described that the flexible substrate 331 is bent with reference to FIG. 6 together.

Referring to FIG. 6, as the bendable area BA is bent, the second non-display area NDA2 of the flexible substrate 331 is disposed on the rear surface of the flexible substrate 331 so as to overlap the first non-display area NDA1 of the flexible substrate 331. The second non-display area NDA2 may also be disposed so as to overlap at least a part of the display area DA as well as the first non-display area NDA1 of the flexible substrate 331.

For example, the bendable area BA is bent toward the rear surface of the flexible substrate 331 such that the second non-display area NDA2 of the flexible substrate 331 overlaps at least a part of the first non-display area NDA1. Accordingly, the second non-display area NDA2 is disposed so as to be opposite to the lower surface of the plate bottom 110. Further, when the bendable area BA is bent, the auxiliary back plate 370 is disposed below the plate bottom 110 which overlaps the first non-display area NDA1. The auxiliary back plate 370 and the plate bottom 110 are bonded by the fourth adhesive layer ADH4.

Specifically, for example, the fourth adhesive layer ADH4 is disposed below the plate bottom 110 overlapping the first non-display area NDA1. The auxiliary base member 371 is disposed below the fourth adhesive layer ADH4. The auxiliary hard coating layer 372 is disposed below the auxiliary base member 371. Further, the third adhesive layer ADH3 is disposed below the auxiliary hard coating layer 372. When the bendable area BA is bent, an end of the second non-display area NDA2 of the flexible substrate 331 is disposed so as to overlap the auxiliary hard coating layer 372. At this time, the second non-display area NDA2 of the flexible substrate 331 may be substantially a flat area. The second non-display area NDA2 of the flexible substrate 331 and the auxiliary hard coating layer 372 are bonded by the third adhesive layer ADH3 disposed therebetween.

As described above, as a part of the non-display area in which the driving IC is disposed is bent toward the rear surface of the flexible substrate 331, a bezel area of the flexible display device 300 may be reduced. Further, as the auxiliary back plate 370 including the auxiliary base member 371 and the auxiliary hard coating layer 372 is disposed on the flexible substrate 331 corresponding to the second non-display area NDA2, the dent or puncture generated during the bending are minimized and the display panel 130 is stably supported.

Hereinafter, the effects of the present disclosure will be described in more detail with reference to Examples and Comparative Examples. However, the following Examples are set forth to illustrate the present disclosure, but the scope of the disclosure is not limited thereto.

Example 1

First, a polyimide film having a thickness of 50 μm was prepared. Next, a hard coat composition including two types of epoxy modified siloxane oligomers having different epoxy equivalents and an initiator were prepared. Next, the hard coat composition was applied on the polyimide film 121 and was cured to form a hard coating layer 122 having a thickness of 40 μm. The flexible display device including the back plate produced as described above was produced to have a structure as illustrated in FIG. 2.

Example 2

Except that the position of the hard coating layer was changed in Example 1 such that the polyimide film was disposed on a lower portion and the hard coating layer was disposed on an upper portion, a flexible display device with the structure as illustrated in FIG. 3 was produced as the same as Example 1.

Example 3

Except that as a base member, a polyethylene terephthalate film with a thickness of 50 μm was used instead of the polyimide film in Example 1, a flexible display device having the same structure as Example 1 was produced.

Example 4

Except that as a base member, a polyethylene terephthalate film with a thickness of 50 μm was used instead of the polyimide film in Example 2, a flexible display device having the same structure as Example 2 was produced.

Comparative Example 1

Except that the formation of the hard coating layer was omitted in Example 1 and a back plate configured by only a polyimide film with a thickness of 50 μm was used, a flexible display device was produced as the same as Example 1.

Comparative Example 2

Except that the formation of the hard coating layer was omitted in Example 3 and a back plate configured by only a polyethylene terephthalate film with a thickness of 50 μm was used, a flexible display device was produced as the same as Example 3.

Experimental Example

A dent characteristic, a puncture strength, and a pattern transferring property of the flexible display device produced as described above were evaluated.
1. Dent Characteristic First, after pressing a specimen with a pencil for one minute while applying a load of 350 gf to the specimens according to Examples 1 to 4 and Comparative Examples 1 and 2, the specimens were left for 24 hours. After 24 hours, whether to have scratch and dent was observed with the naked eye. The result thereof was filled in the following Table 1.
2. Puncture Strength A puncture strength of the flexible display device was measured using a universal testing machine (texture analyzer). Specifically, a folding area was pressed with a punching probe (a diameter is 2 mm and stainless) while increasing a force applied to the specimen to measure a maximum puncture load. The maximum puncture load was determined by a load when a damage such as a bright spot or a dark spot was generated on the display panel. The result thereof was filled in the following Table 1.
3. Whether to Transfer Opening Pattern After storing the flexible display device for 10 days under the condition of 60° C. and 90% of relative humidity, the visibility of the opening pattern formed on the plate bottom under a fluorescent lamp of 700 lx was evaluated with the naked eye. According to the degree of visible recognition of the pattern, it was determined as very weak, weak, medium, medium strong, and strong. The result thereof was filled in the following Table 1.

TABLE 1

|  | Ex. 1 | Ex. 2 | Ex. 3 | Ex. 4 | Comp. Ex. 1 | Comp. Ex. 2 |
| --- | --- | --- | --- | --- | --- | --- |
| Dent characteristic | H-2H | H-2H | H-2H | H-2H | H-2H | H-2H |
| Puncture strength (Kgf) | 5 | 5.5 | 5.5 | 5.5 | 3.5 | 3.5 |
| Whether to transfer opening pattern | Weak | Weak | Weak | Weak | Medium | Strong |

Referring to Table 1, it is confirmed that in the flexible display device according to Examples 1 to 4 of the present disclosure, a puncture strength in a folding area in which the strength is relatively lowered due to the opening pattern while maintaining the dent characteristic to be high is significantly improved as compared with Comparative Examples 1 and 2.

Further, it is further confirmed that in the flexible display device according to Examples 1 to 4 of the present disclosure, the hard coating layer is formed on the base member of the back plate so that the degree of visible recognition of the opening pattern is weaker than Comparative Examples 1 and 2.

The exemplary embodiments of the present disclosure can also be described as follows:

According to an aspect of the present disclosure, a flexible display device comprises a display panel, a back plate disposed below the display panel, and a plate bottom disposed below the back plate, wherein the back plate includes a base member and a hard coating layer disposed on an upper surface or a lower surface of the base member.

The base member may be selected from a polyethylene terephthalate film, a polyimide film, and a polyamideimide film.

The hard coating layer may include a silicon-based resin.

The silicon-based resin may be formed from an epoxy modified siloxane oligomer.

The silicon-based resin may be formed by polymerizing a composition including a first epoxy modified siloxane oligomer and a second epoxy modified siloxane oligomer having a different epoxy equivalent from that of the first epoxy modified siloxane oligomer.

The composition further may include one or more types selected from a urethane acrylate-based linker, an acrylate-based linker, and an epoxy-based linker.

A thickness of the hard coating layer may be 30 μm to 60 μm.

The flexible display device may further comprise a first adhesive layer which is disposed between the back plate and the plate bottom to bond the back plate and the plate bottom and a second adhesive layer which is disposed between the back plate and the display panel to bond the back plate and the display panel.

The flexible display device may include a folding area and a non-folding area, and the plate bottom may have an opening pattern formed to correspond to the folding area.

The display panel may include a flexible substrate and a device layer on the flexible substrate, the flexible substrate may include a display area, a first non-display area enclosing the display area, a bendable area extending from the first non-display area, and a second non-display area extending from one side of the bendable area and the bendable area may be bent toward a rear surface of the flexible substrate so that the second non-display area of the flexible substrate overlaps at least a part of the first non-display area.

The flexible display device may further comprise an auxiliary back plate disposed below the plate bottom so as to correspond to the first non-display area.

The auxiliary back plate may be disposed on the same surface as the back plate and may be spaced apart from one side of the back plate.

The auxiliary back plate may include an auxiliary base member and an auxiliary hard coating layer disposed on an upper surface or a lower surface of the auxiliary base member.

The auxiliary base member may be formed of the same material as the base member and the auxiliary hard coating layer may be formed of the same material as the hard coating layer.

The bendable area may be bent toward the rear surface of the flexible substrate and the second non-display area of the flexible substrate may be disposed so as to overlap at least a part of the auxiliary back plate.

The flexible display device may further comprise a third adhesive layer which is disposed between the flexible substrate and the auxiliary back plate to bond the flexible substrate and the auxiliary back plate and a fourth adhesive layer which is disposed between the auxiliary back plate and the plate bottom to bond the auxiliary back plate and the plate bottom.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display device, comprising:
    a display panel;
    a back plate disposed below the display panel; and
    a plate bottom disposed below the back plate,
        wherein the back plate includes a base member and a hard coating layer disposed on an upper surface or a lower surface of the base member, and
            wherein the hard coating layer includes a silicon-based resin.

2. The flexible display device according to claim 1, wherein the base member is selected from the group consisting of a polyethylene terephthalate film, a polyimide film, and a polyamideimide film.

3. The flexible display device according to claim 1, wherein the silicon-based resin is formed from an epoxy modified siloxane oligomer.

4. The flexible display device according to claim 3, wherein the silicon-based resin is formed by polymerizing a composition including a first epoxy modified siloxane oligomer and a second epoxy modified siloxane oligomer having a different epoxy equivalent from that of the first epoxy modified siloxane oligomer.

5. The flexible display device according to claim 4, wherein the composition further includes one or more types selected from the group consisting of a urethane acrylate-based linker, an acrylate-based linker, and an epoxy-based linker.

6. The flexible display device according to claim 4, wherein a thickness of the hard coating layer is 30 µm to 60 µm.

7. The flexible display device according to claim 1, further comprising:
    a first adhesive layer which is disposed between the back plate and the plate bottom to bond the back plate and the plate bottom; and
    a second adhesive layer which is disposed between the back plate and the display panel to bond the back plate and the display panel.

8. The flexible display device according to claim 1, wherein the flexible display device includes a folding area and a non-folding area, and the plate bottom has an opening pattern formed to correspond to the folding area.

9. The flexible display device according to claim 1, wherein the display panel includes a flexible substrate and a device layer on the flexible substrate,
    the flexible substrate includes a display area, a first non-display area enclosing the display area, a bendable area extending from the first non-display area, and a second non-display area extending from one side of the bendable area and
    the bendable area is bent toward a rear surface of the flexible substrate so that the second non-display area of the flexible substrate overlaps at least a part of the first non-display area.

10. The flexible display device according to claim 9, further comprising:
    an auxiliary back plate disposed below the plate bottom so as to correspond to the first non-display area.

11. The flexible display device according to claim 10, wherein the auxiliary back plate is disposed on a same surface as the back plate and is spaced apart from one side of the back plate.

12. The flexible display device according to claim 10, wherein the auxiliary back plate includes an auxiliary base member and an auxiliary hard coating layer disposed on an upper surface or a lower surface of the auxiliary base member.

13. The flexible display device according to claim 12, wherein the auxiliary base member is formed of a same material as the base member and the auxiliary hard coating layer is formed of a same material as the hard coating layer.

14. The flexible display device according to claim 10, wherein the second non-display area of the flexible substrate is disposed so as to overlap at least a part of the auxiliary back plate.

15. The flexible display device according to claim 10, further comprising:
    a third adhesive layer which is disposed between the flexible substrate and the auxiliary back plate to bond the flexible substrate and the auxiliary back plate; and
    a fourth adhesive layer which is disposed between the auxiliary back plate and the plate bottom to bond the auxiliary back plate and the plate bottom.

16. A flexible display device, comprising:
    a display panel;
    a back plate disposed below the display panel; and
    a plate bottom disposed below the back plate,
        wherein the back plate includes a base member and a hard coating layer disposed on an upper surface or a lower surface of the base member, and wherein the base member is selected from the group consisting of a polyethylene terephthalate film, a polyimide film, and a polyamideimide film.

* * * * *